United States Patent
Hutchison et al.

(10) Patent No.: US 9,056,430 B2
(45) Date of Patent: Jun. 16, 2015

(54) CASING WALL FOR AN APPARATUS

(75) Inventors: Hutch Hutchison, Churt Surrey (GB); Caroline Millar, Bramley Surrey (GB)

(73) Assignee: Vertu Corporation Limited, Church Crookham Hampshire (GB)

( * ) Notice: Subject to any disclaimer, the term of this patent is extended or adjusted under 35 U.S.C. 154(b) by 1105 days.

(21) Appl. No.: 12/531,751

(22) PCT Filed: Mar. 18, 2008

(86) PCT No.: PCT/EP2008/053242
§ 371 (c)(1),
(2), (4) Date: Dec. 7, 2009

(87) PCT Pub. No.: WO2008/113808
PCT Pub. Date: Sep. 25, 2008

(65) Prior Publication Data
US 2010/0127605 A1  May 27, 2010

(30) Foreign Application Priority Data
Mar. 19, 2007 (GB) .................................. 0705217.8

(51) Int. Cl.
| | |
|---|---|
| H04M 1/00 | (2006.01) |
| H05K 7/00 | (2006.01) |
| B29C 70/74 | (2006.01) |
| H05K 5/02 | (2006.01) |
| B29K 709/02 | (2006.01) |

(52) U.S. Cl.
CPC ........... *B29C 70/74* (2013.01); *Y10T 29/49826* (2015.01); *B29K 2709/02* (2013.01); *H05K 5/02* (2013.01); *H05K 5/0243* (2013.01)

(58) Field of Classification Search
CPC ............ H04B 1/3888; H04M 1/0283; H04M 1/0214; H04M 1/23
USPC .................. 455/575.1–575.4, 575.8; 361/679.01–679.09, 679.55–679.56
See application file for complete search history.

(56) References Cited

U.S. PATENT DOCUMENTS

| | | | |
|---|---|---|---|
| 4,734,679 A | 3/1988 | Haskins ..................... 340/365 R |
| 4,862,499 A * | 8/1989 | Jekot et al. ..................... 379/368 |
| 5,590,546 A * | 1/1997 | Hector .............................. 63/38 |
| 2003/0083110 A1 | 5/2003 | Lutche et al. ................. 455/567 |
| 2003/0160712 A1* | 8/2003 | Levy .............................. 341/22 |
| 2006/0029779 A1* | 2/2006 | Kim et al. .................. 428/195.1 |
| 2006/0139898 A1* | 6/2006 | Takei ........................... 361/755 |
| 2006/0188668 A1* | 8/2006 | Wahba ............................ 428/13 |
| 2006/0268528 A1 | 11/2006 | Zadesky et al. ............... 361/728 |
| 2007/0295588 A1* | 12/2007 | Kamata ....................... 200/341 |
| 2008/0032095 A1* | 2/2008 | Kato et al. .................... 428/139 |

FOREIGN PATENT DOCUMENTS

| | | |
|---|---|---|
| DE | 102 08 336 A1 | 9/2003 |
| EP | 220 720 A2 | 5/1987 |
| EP | 1 356 658 A0 | 12/2001 |
| GB | 2 069 402 A | 8/1981 |

(Continued)

*Primary Examiner* — Dung Hong
(74) *Attorney, Agent, or Firm* — Harrington & Smith

(57) ABSTRACT

A casing wall for an apparatus, the casing wall comprising including a chassis and casing wall elements integrated into the chassis, the casing wall elements each including a surface exposed to a user, the chassis defining a continuum between the integrated casing wall elements to provide structural rigidity to the casing wall.

19 Claims, 4 Drawing Sheets

(56) References Cited

FOREIGN PATENT DOCUMENTS

| | | |
|---|---|---|
| JP | 2003-326897 | 11/2003 |
| WO | 360 883 A0 | 7/2002 |
| WO | WO 2005109460 A1 * | 11/2005 |
| WO | WO 2006022313 A1 * | 3/2006 |

* cited by examiner

CASING WALL FOR AN APPARATUS

FIELD OF THE INVENTION

Embodiments of the present invention relate to a casing wall for an apparatus. Embodiments of the invention also relate to a method of forming a casing wall for an apparatus.

BACKGROUND TO THE INVENTION

There is a continuing desire to provide apparatus, such as personal electronic devices, which have improved aesthetic appeal. One of the ways this has been achieved is by employing non-conventional materials, such as precious materials, to fabricate elements of such apparatus, for example casing walls.

Precious materials, such as glass and ceramic materials including zirconia and alumina, are very durable and are thus suitable for the fabrication of elements such as casing walls, and it would be desirable to provide an improved casing wall for an apparatus such as a personal communication device.

BRIEF DESCRIPTION OF THE INVENTION

According to one embodiment of the invention, there is provided a casing wall for an apparatus, the casing wall comprising a chassis and casing wall elements integrated into the chassis, the casing wall elements each including a surface exposed to a user, the chassis defining a continuum between the integrated casing wall elements.

According to another embodiment of the invention, there is provided an apparatus including a casing wall, the casing wall comprising a chassis and casing wall elements integrated into the chassis, the casing wall elements each including a surface exposed to a user, the chassis defining a continuum between the integrated casing wall elements.

According to another embodiment of the invention, there is provided a method of forming a casing wall for an apparatus, the method comprising integrating casing wall elements into a chassis such that a surface of each integrated casing wall element is exposed to a user, the chassis defining a continuum between the integrated casing wall elements.

According to another embodiment of the invention, there is provided a method comprising integrating casing wall elements into a chassis such that a surface of each integrated casing wall element is exposed to a user, the chassis defining a continuum between the integrated casing wall elements.

In some embodiments, the continuum defined between the integrated casing wall elements provides structural rigidity to the casing wall and/or the casing wall elements.

According to one embodiment of the invention, there is provided a casing wall for an apparatus, the casing wall comprising a chassis and casing wall elements integrated into the chassis, the casing wall elements each including a surface exposed to a user, the chassis defining a continuum between the integrated casing wall elements to provide structural rigidity to the casing wall.

According to another embodiment of the invention, there is provided an apparatus including a casing wall, the casing wall comprising a chassis and casing wall elements integrated into the chassis, the casing wall elements each including a surface exposed to a user, the chassis defining a continuum between the integrated casing wall elements to provide structural rigidity to the casing wall.

According to another embodiment of the invention, there is provided a method of forming a casing wall for an apparatus, the method comprising integrating casing wall elements into a chassis such that a surface of each integrated casing wall element is exposed to a user, the chassis defining a continuum between the integrated casing wall elements to provide structural rigidity to the casing wall.

According to another embodiment of the invention, there is provided a method comprising integrating casing wall elements into a chassis such that a surface of each integrated casing wall element is exposed to a user, the chassis defining a continuum between the integrated casing wall elements to provide structural rigidity to the casing wall elements.

Embodiments of the invention also provide a portable electronic device including a casing wall as defined above. The portable electronic device may be a portable communication device.

The chassis may act as a matrix into which the casing wall elements may be integrated. Integration of the casing wall elements may be achieved by embedding the casing wall elements into the chassis. Integration of the casing wall elements may be achieved by setting the casing wall elements into the chassis. The chassis may provide a substrate for the casing wall elements. The continuum provided by the chassis may consolidate the casing wall elements. The chassis and consolidated casing wall elements may thus form a coherent casing wall. The chassis may at least partly interconnect the casing wall elements and may retain the casing wall elements in predetermined positions relative to each other.

The chassis may comprise a material which enables the casing wall elements to be firmly integrated into the chassis and securely retained in position. The material may have the ability to flex and may thus permit limited relative movement between the casing wall elements. The material may be a resilient material such as a plastics material. The material from which the chassis is formed may be a cured resinous material. The ability of the chassis to flex and allow limited relative movement between the integrated casing wall elements may provide the casing wall with the ability to absorb impacts with no or minimal damage to the casing wall elements.

The casing wall elements may each be formed from precious material. The term 'precious material' as used herein includes ceramic materials such as zirconia and alumina, glass, metals such as gold, silver or platinum, and precious or semi-precious stones, such as diamond, sapphire or ruby.

BRIEF DESCRIPTION OF THE DRAWINGS

Embodiments of the invention will now be described by way of example only and with reference to the accompanying drawings, in which.

DETAILED DESCRIPTION OF EMBODIMENTS OF THE INVENTION

Figure 1:
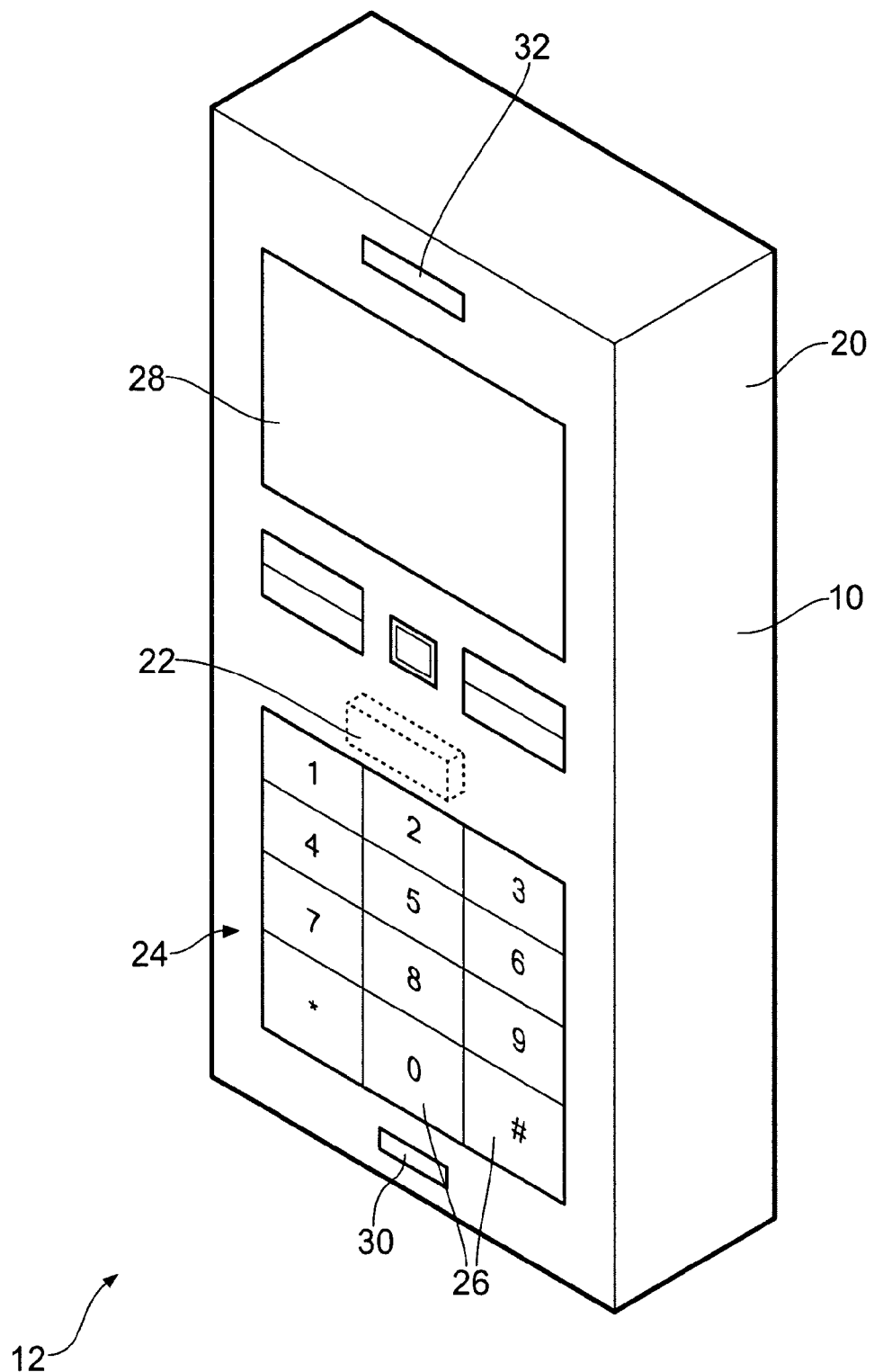
FIG. 1 is a diagrammatic perspective view of an apparatus.

The figures illustrate a casing wall 10 for an apparatus 12, the casing wall 10 comprising a chassis 14 and casing wall elements 16 integrated into the chassis 14, the casing wall elements 16 each including a surface 18 exposed to a user, the chassis 14 defining a continuum 19 between the integrated casing wall elements 16 to provide structural rigidity to the casing wall 10.

FIG. 1 is a diagrammatic illustration of an apparatus 12. The apparatus 12 may be a hand portable electronic device and may be a portable communication device, personal music player, personal digital assistant, etc. In the following embodiment, the apparatus 12 will be referred to as a 'portable communication device'. The portable communication device includes a casing wall 10 which forms part of a casing 20 housing an operating engine 22 of the device. The portable communication device includes a user input interface 24 comprising a plurality of user input keys 26, a display 28, a microphone 30 and a speaker 32. The portable communication device operates in a conventional manner which will be apparent to the skilled person.

As indicated above, the casing wall 10 comprises a chassis 14 and casing wall elements 16 integrated into the chassis 14. The casing wall elements 16 are each formed from a precious material, for example a ceramic material such as zirconia or alumina. The use of precious material is desirable since precious materials, such as zirconia and alumina, are hard and therefore durable materials which do not easily wear and which at the same time have a highly desirable aesthetic appearance.

In order to minimise the weight of the casing wall 10, and hence of an apparatus 12 including a casing 20 which may be formed by one or more of the casing walls 10, the thickness of the casing wall elements 16 is minimised. This reduces the structural rigidity of the casing wall elements 16 and makes them more brittle. Integration of the casing wall elements 16 into the chassis 14 provides the integrated casing wall elements 16, and the resulting casing wall 10, with structural rigidity.

The chassis 14 acts as a matrix into which the casing wall elements 16 are integrated and provides a substrate for the casing wall elements 16. The chassis 14 provides a continuum 19 between the casing wall elements 16 and consolidates the casing wall elements 16 into a coherent casing wall 10. The chassis 14 at least partly interconnects the casing wall elements 16 and retains the casing wall elements 16 in predetermined positions relative to each other.

The chassis 14 comprises a material which enables the casing wall elements 16 to be firmly integrated into the chassis 14 and securely retained in position, yet which allows some flexing and slight relative movement between the casing wall elements 16 whilst providing the integrated casing wall elements 16 with the requisite structural rigidity. The ability of the chassis 14 to flex and allow some relative movement between the integrated casing wall elements 16 may provide the casing wall 10 with the ability to absorb impacts without any damage occurring to the casing wall elements 16 themselves.

The casing wall elements 16 are integrated into the chassis 14 at predetermined, possibly spaced, positions which may lie on a plane. Where the exposed surfaces 18 of the casing wall elements 16 are generally planar, as in the embodiments of FIGS. 2, 3, 4, 6 and 7, the casing wall elements 16 may be integrated into the chassis 14 such that those exposed surfaces 18 are substantially coplanar.

The casing wall elements 16 are at least partially embedded into the chassis 14 to integrate them into the chassis 14. Integration of the casing wall elements 16 into the chassis 14 may be achieved by forming the chassis 14 around the casing wall elements 16. For example, the material from which the chassis 14 is formed may be a resinous material, and the casing wall elements 16 may be located, for example at least partially embedded, in uncured resinous material which may then be cured to form the chassis 14, the casing wall elements 16 being integrated into the chassis during curing of the resinous material to form the chassis 14.

Figure 4:
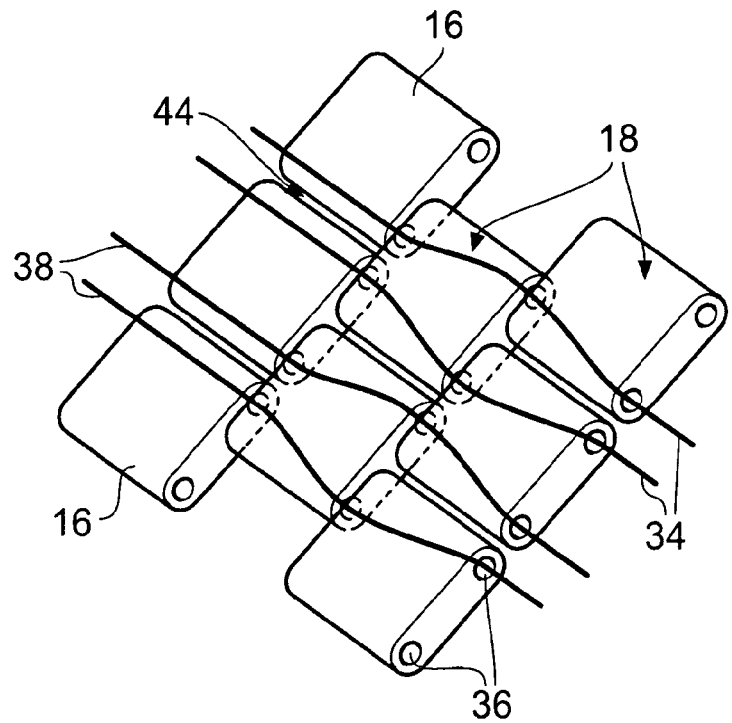
FIG. 4 is a diagrammatic perspective view of one embodiment of part of a casing wall for an apparatus.
Figure 5:
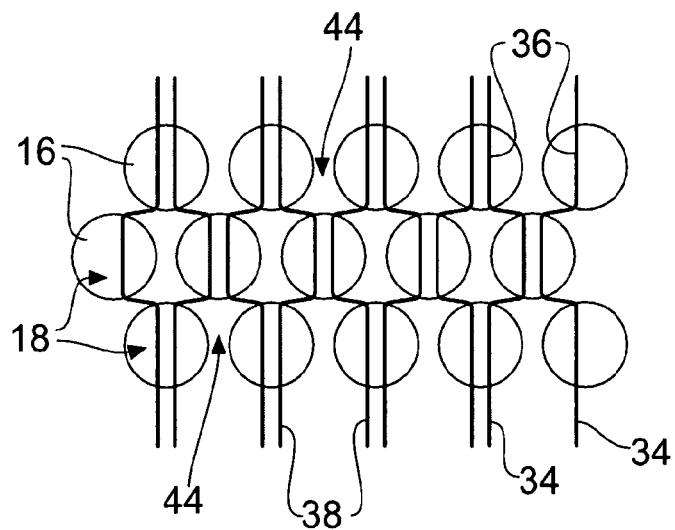
FIG. 5 is a diagrammatic plan view of another embodiment of part of a casing wall for an apparatus.

Referring to FIGS. 2 to 5, in embodiments of the invention, the casing wall elements 16 may be discrete or separate elements and may be at least partly interconnected by connecting elements 34 as shown in FIGS. 4 and 5. One or more of the connecting elements 34 may be used to interconnect the casing wall elements 16 before the casing wall elements 16 are integrated into the chassis 14 to form the casing wall 10. The connecting elements 34 may be operable to maintain the casing wall elements 16 in a predetermined spaced relationship which may facilitate integration of the casing wall elements 16 into the chassis 14, for example by facilitating positioning of the casing wall elements 16 in the uncured resinous material from which the chassis 14 is to be formed by curing the material.

In the embodiments of FIGS. 4 and 5, the connecting elements 34 extend through apertures 36 in the casing wall elements 16 and thus act to interconnect the casing wall elements 16, for example by stringing them together. In embodiments of the invention, the connecting elements 34 are in the form of threads 38 or thread-like elements which may be formed of any suitable material.

In the embodiment of FIG. 4, each casing wall element 16 includes two apertures 36, each adapted to receive a separate connecting element 34 for connecting each casing wall element 16 to adjacent casing wall elements 16. In the embodiment of FIG. 5, each casing wall element 16 includes a single aperture 36 adapted to receive at least two connecting elements 34 for connecting each casing wall element 16 to adjacent casing wall elements 16.

Figure 6:
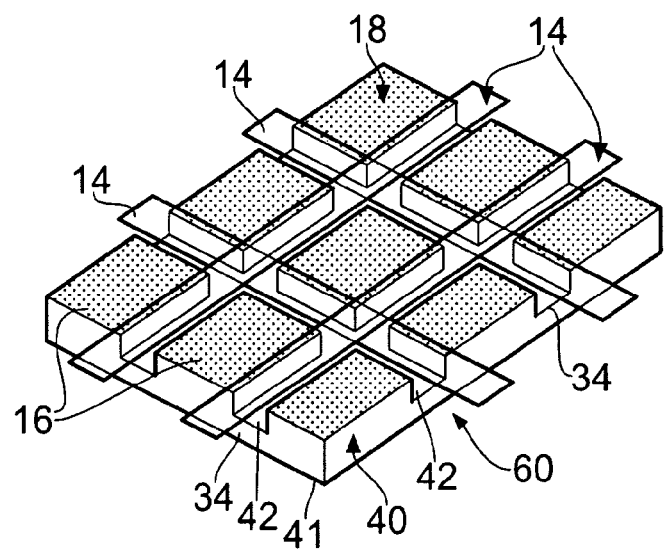
FIG. 6 is a diagrammatic perspective view of another embodiment of part of a casing wall for an apparatus.

In the embodiment of FIG. 6, the casing wall elements 16 are formed from a sheet 40 of material in which channels 42 are formed. The casing wall elements 16 are thus integral with the sheet 40 of material and the connecting elements 34 interconnecting the casing wall elements 16 are provided by the material of the sheet 40 which extends across the channels 42 between adjacent casing wall elements 16. The sheet 40 of material can be considered to define a continuous substrate 41 with the casing wall elements 16 being integral with and extending from the substrate 41.

Interconnection of the casing wall elements 16 by the connecting elements 34, as illustrated in the embodiments of FIGS. 4 to 6, does not provide the casing wall elements 16 with sufficient structural rigidity to form a casing wall 10 for an apparatus 12. As indicated above, it is the chassis 14 into which the casing wall elements 16 are integrated and the continuum 19 provided by the chassis 14 that provide the casing wall elements 12 and the casing wall 10 with structural rigidity.

The casing wall elements 16 are spaced apart at predetermined positions and are embedded into the chassis 14 such that the chassis 14 at least partly envelops the casing wall elements 14 and fills voids 44 that may be present between the casing wall elements 16. The material of the chassis 14 is provided below the casing wall elements 16 and between the casing wall elements 16 to define the continuum 19. In the embodiment of FIG. 6, the material of the chassis 14 is provided in the channels 42 above the continuous substrate 41. Thus, if cracks 60 appear in the substrate 41 after integration into the chassis 14, the structural rigidity of the casing wall 10 is maintained by the chassis 14.

Figure 7:
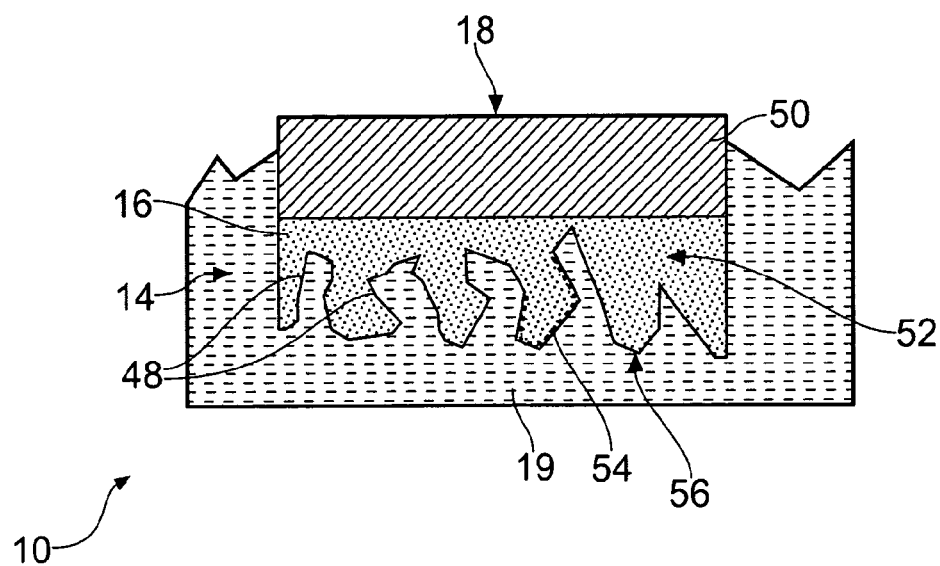
FIG. 7 is a cross-sectional view of part of a casing wall for an apparatus.

Referring to FIG. 7, in embodiments of the invention, a casing wall element 16 may include a first region 50 including the exposed surface 18 and a second region 52, or integration region, which is more compatible with the material from which the chassis 14 is formed to facilitate integration of the casing wall element 16 into the chassis 14, for example by providing an enhanced interlock between the casing wall element 16 and the chassis 14. For example, the porosity of the second region 52 may be greater than the porosity of the first region 50. Accordingly, uncured resinous material from which the chassis 14 may be formed may permeate into the second region 52 before it is cured such that when the resinous material is cured to form the chassis 14, an improved interlock is created between the casing wall element 16 and the chassis 14.

Alternatively or in addition, the second region 52 may include formations 48, for example regular or irregular formations 48 which may be created by deforming the second region 52, into which uncured resinous material from which the chassis 14 is formed may flow such that when the material is cured to form the chassis 14, an improved interlock or mechanically 'keyed' zone is created between the casing wall element 16 and the chassis 14.

In some embodiments of the invention, an adherent 54 (illustrated diagrammatically in FIG. 7 by a broken line), which has an affinity to adhere to the material of the casing wall elements 16 and the material of the chassis 14, may be provided at an interface 56 between the casing wall elements 16 and the chassis 14 to facilitate integration of the casing wall elements 16 into the chassis 14.

Figure 2:
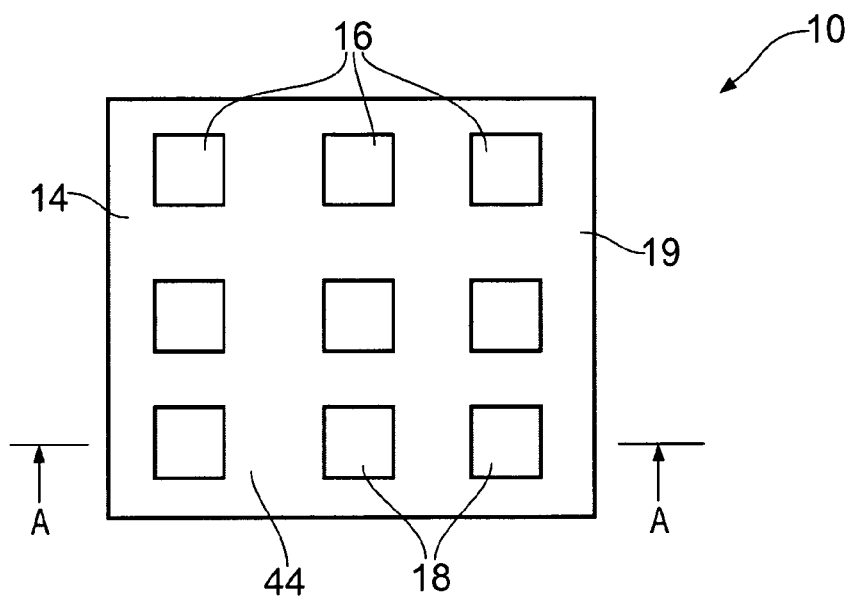
FIG. 2 is a diagrammatic plan view of a casing wall for an apparatus.
Figure 3:
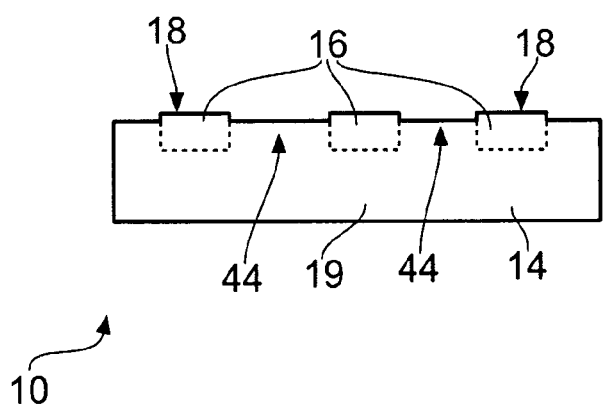
FIG. 3 is a diagrammatic cross-sectional view along the line A-A of FIG. 2.

Due to the spacing between the exposed surfaces 18 of the casing wall elements 16, the exposed surfaces 18 may define a discontinuous wall surface with the continuum 19 provided by the chassis 14 providing the appearance of a filler between the casing wall elements 16. The casing wall 10 may thus have a mosaic appearance, as best seen in FIG. 2, which may be aesthetically appealing to a user of the apparatus 12.

During formation of the casing wall 10, it is possible that resinous material from which the chassis 14 is formed may be present on the exposed surfaces 18 of the casing wall elements 16. In this situation, the material may be removed after curing, for example by polishing or a similar operation, thus ensuring that the exposed surfaces 18 of the casing wall elements 16 of the casing wall 10 are visible to a user of an apparatus 12 including the casing wall 10.

As indicated above, the casing wall 10 may be formed by locating the casing wall elements 16 in uncured resinous material and curing the resinous material to provide a chassis 14 into which the casing wall elements 16 are integrated, and any suitable technique may be employed to for this purpose. For example, uncured resinous material may be poured over the casing wall elements 16 and cured to form the chassis 14. The casing wall elements 16 could be located in a chamber into which uncured resinous material may be introduced for subsequent curing to form the chassis 14. In this case, the uncured resinous material could be forced into the chamber under pressure or drawn into the chamber using a vacuum. Injection moulding, compression moulding, or other similar techniques which will be apparent to those skilled in the art, could be employed to form the casing wall 10.

Although embodiments of the invention have been described in the preceding paragraphs with reference to various examples, it should be appreciated that various modifications to the examples given may be made without departing from the scope of the present invention, as claimed.

For example, the casing wall elements 16 may be formed of a material other than a precious material. Where the casing wall elements 16 are formed of a precious material, the precious material may be a material other than a ceramic material. For example, the precious material may be precious stones such as sapphire or diamond, or may be glass. The casing wall elements 16 may be integrated into the chassis 14 as discrete elements, the interconnection between the casing wall elements 16 being provided solely by the chassis 14.

The casing wall elements 16 may be integrated into the chassis 14 in a randomly spaced manner or according to a defined geometric pattern. The casing wall elements 16 may each be of equal or differing size, may be of the same or different shapes, may be of the same or different colours, may be polished and/or textured to enhance the aesthetic appearance of the casing wall 10. In embodiments where the casing wall elements 16 are of the same colour, the material from which the chassis 14 is formed may also be coloured to match the colour of the casing wall elements 16.

Location and/or attachment and/or retention features may be incorporated into the chassis 14 during curing of the resinous material and/or after the resinous material has been cured to form the chassis 14.

Whilst endeavouring in the foregoing specification to draw attention to those features of the invention believed to be of particular importance, it should be understood that the Applicant claims protection in respect of any patentable feature or combination of features hereinbefore referred to and/or shown in the drawings, whether or not particular emphasis has been placed thereon.

We claim:

1. A casing wall for an apparatus, the casing wall comprising a chassis and casing wall elements at least partially embedded into the chassis to integrate them into the chassis, the casing wall elements each including a surface exposed to a user, wherein the casing wall elements include an integration region to facilitate integration into the chassis, and the integration region having a high porosity relative to the remainder of the casing wall elements, the chassis defining a continuum between the integrated casing wall elements at least partly enveloping the casing wall elements and comprising a resilient material, wherein the chassis retains the integrated casing wall elements flexibly in predetermined positions.

2. A casing wall according to claim 1, wherein the connecting element interconnects the casing wall elements to locate the casing wall elements at predetermined spaced positions.

3. A casing wall according to claim 1, wherein the connecting element extends through apertures in the casing wall elements.

4. A casing wall according to claim 1, wherein the casing wall elements comprise discrete wall elements integrated into the chassis or wherein the casing wall elements are formed integrally from a sheet of material.

5. A portable electronic device including a casing wall according to claim 1.

6. A casing wall according to claim 1, wherein the integration region includes a plurality of formations for providing an interlock between the casing wall elements and the chassis.

7. A casing wall according to claim 1, wherein the chassis is moulded around the casing wall elements to integrate the casing wall elements into the chassis.

8. A casing wall according to claim 1, wherein the casing wall elements are integrated into the chassis at spaced positions lying on a plane.

9. A casing wall according to claim 1, wherein the interconnection between the integrated casing wall elements is operable to retain the casing wall elements at predetermined positions.

10. A casing wall according to claim 1, wherein the interconnection between the casing wall elements is provided at least partly by the chassis.

11. A casing wall according to claim 1, wherein the casing wall includes an adherent to facilitate integration of the casing wall elements into the chassis.

12. A casing wall according to claim 1, wherein the exposed surfaces of the casing wall elements are substantially coplanar.

13. A casing wall according to claim 1, wherein the chassis comprises a resinous material.

14. A casing wall according to claim 1, wherein the casing wall elements are interconnected at least partly by a connecting element, the connecting element being separate from the casing wall elements.

15. A method comprising at least partially embedding casing wall elements into a chassis to integrate the casing wall elements into the chassis such that a surface of each integrated wall element is exposed to a user to form a casing wall for an apparatus, wherein the casing wall elements include an integration region to facilitate integration into the chassis, and the integration region having a high porosity relative to the remainder of the casing wall elements, the chassis defining a continuum between the integrated casing wall elements at least partly enveloping the casing wall elements and comprising a resilient material, wherein the chassis retains the integrated casing wall elements flexibly in predetermined positions.

16. A method according to claim 15, wherein the method comprises interconnecting the casing wall elements prior to integrating the casing wall elements into the chassis.

17. A method according to claim 15, wherein the method comprises moulding the chassis around the casing wall elements to integrate the casing wall elements into the chassis.

18. A method according to claim 15, wherein the method comprises creating formations in the casing wall elements to facilitate integration of the casing wall elements into the chassis.

19. A method according to claim 15, wherein the apparatus is a portable communication device.

* * * * *